(12) United States Patent
Bang et al.

(10) Patent No.: US 11,730,018 B2
(45) Date of Patent: Aug. 15, 2023

(54) DISPLAY PANEL HAVING PHOTOREFRACTIVE PORTION AND ELECTRONIC DEVICE INCLUDING THE SAME

(71) Applicant: Samsung Display Co., Ltd., Yongin-si (KR)

(72) Inventors: Hyunchol Bang, Yongin-si (KR); Wonkyu Kwak, Yongin-si (KR); Sunghwan Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 178 days.

(21) Appl. No.: 17/008,230

(22) Filed: Aug. 31, 2020

(65) Prior Publication Data
US 2021/0175303 A1   Jun. 10, 2021

(30) Foreign Application Priority Data
Dec. 9, 2019   (KR) .......................... 10-2019-0162915

(51) Int. Cl.
| | |
|---|---|
| *H10K 59/122* | (2023.01) |
| *H10K 50/84* | (2023.01) |
| *H10K 50/805* | (2023.01) |
| *H10K 59/65* | (2023.01) |
| *H10K 59/131* | (2023.01) |
| *H10K 77/10* | (2023.01) |

(52) U.S. Cl.
CPC ......... *H10K 59/122* (2023.02); *H10K 50/805* (2023.02); *H10K 50/84* (2023.02); *H10K 59/131* (2023.02); *H10K 59/65* (2023.02); *H10K 77/111* (2023.02)

(58) Field of Classification Search
CPC ............. H01L 27/3246; H01L 27/3234; H01L 27/3276; H01L 51/5203; H01L 51/5237
USPC .......................................................... 257/40
See application file for complete search history.

(56) References Cited

U.S. PATENT DOCUMENTS

| | | | | |
|---|---|---|---|---|
| 2008/0044761 | A1* | 2/2008 | Son | G03F 7/0007 |
| | | | | 430/319 |
| 2011/0024720 | A1* | 2/2011 | Chen | H01L 33/44 |
| | | | | 977/755 |
| 2011/0220901 | A1* | 9/2011 | Ha | H01L 51/5088 |
| | | | | 257/59 |
| 2014/0183472 | A1* | 7/2014 | Kim | H01L 27/326 |
| | | | | 438/34 |

(Continued)

FOREIGN PATENT DOCUMENTS

| | | |
|---|---|---|
| CN | 108418928 A | 8/2018 |
| CN | 110177162 A | 8/2019 |

(Continued)

*Primary Examiner* — Xia L Cross
(74) *Attorney, Agent, or Firm* — Lewis Roca Rothgerber Christie LLP

(57) ABSTRACT

A display panel includes: a substrate comprising a first display area and a second display area surrounded by the first display area; an insulating layer including an organic insulating material; a plurality of first light-emitting elements in the first display area; a plurality of second light-emitting elements in the second display area, the second light-emitting elements comprising light-emitting elements separated from one another to define transmission areas; and a photorefractive portion in each of the transmission areas.

20 Claims, 9 Drawing Sheets

(56) References Cited

U.S. PATENT DOCUMENTS

| | | | |
|---|---|---|---|
| 2015/0228700 A1* | 8/2015 | Cho | H01L 27/3248 257/40 |
| 2018/0090702 A1* | 3/2018 | Um | H01L 51/56 |
| 2018/0156951 A1* | 6/2018 | Baek | G02F 1/133512 |
| 2019/0251318 A1 | 8/2019 | Jung et al. | |
| 2020/0133040 A1 | 4/2020 | Bang et al. | |

FOREIGN PATENT DOCUMENTS

| | | |
|---|---|---|
| KR | 10-2019-0098874 A | 8/2019 |
| KR | 10-2020-0050059 A | 5/2020 |

\* cited by examiner

DISPLAY PANEL HAVING PHOTOREFRACTIVE PORTION AND ELECTRONIC DEVICE INCLUDING THE SAME

CROSS-REFERENCE TO RELATED APPLICATION

The present application claims priority to and the benefit of Korean Patent Application No. 10-2019-0162915, filed on Dec. 9, 2019, in the Korean Intellectual Property Office, the disclosure of which is incorporated herein in its entirety by reference.

BACKGROUND

1. Field

Aspects of one or more example embodiments relate to a display panel and an electronic device including the display panel.

2. Description of Related Art

Display devices may be utilized for various purposes. Also, because the thickness and weight of the display devices has reduced as technology improves, the utilization range of the display devices has increased.

Depending on the intended use of the display apparatus, different methods of designing a shape thereof may be utilized and more functions may be embedded in or linked to the display apparatuses.

The above information disclosed in this Background section is only for enhancement of understanding of the background and therefore the information discussed in this Background section does not necessarily constitute prior art.

SUMMARY

Aspects of one or more example embodiments includes a display panel including an area in which an electronic component such as a sensor, a camera, etc. may be arranged therein and an electronic device including the display panel. Aspects of one or more example embodiments includes a display panel capable of increasing intensity of light incident to an electronic component through a transmission area and preventing or reducing diffracted light in the light incident to the display panel from unintentionally being incident to the electronic component, and an electronic device including the display panel. However, the above technical features are merely examples, and the scope of embodiments according to the present disclosure are not limited thereto.

Additional aspects will be set forth in part in the description which follows and, in part, will be apparent from the description, or may be learned by practice of the presented example embodiments of the disclosure.

According to some example embodiments, a display panel includes: a substrate including a first display area and a second display area surrounded by the first display area, an insulating layer including an organic insulating material, first light-emitting elements in the first display area, second light-emitting elements in the second display area, the second light-emitting elements including light-emitting elements separated from one another to define transmission areas, and a photorefractive portion in each of the transmission areas.

According to some example embodiments, the display panel may further include a light-blocking layer corresponding to the second light-emitting elements and wirings electrically connected to the second light-emitting elements respectively.

According to some example embodiments, the light-blocking layer is on the substrate and under the second light-emitting elements and the wirings.

According to some example embodiments, the light-blocking layer may include metal or a black pigment or dyes.

According to some example embodiments, the photorefractive portion in each of the transmission areas may include a plurality of portions.

According to some example embodiments, the photorefractive portion may include a first surface and a second surface, the first surface facing the substrate and the second surface being opposite to the first surface, and the second surface may include a curved surface.

According to some example embodiments, in the second surface of the photorefractive portion, a central portion may include a flat surface and an edge includes the curved surface.

According to some example embodiments, the photorefractive portion may have a refractive index in a range of 1.4 to 1.7.

According to some example embodiments, the photorefractive portion may include an organic insulating material.

According to some example embodiments, the photorefractive portion may include a material same as a material of the insulating layer.

According to some example embodiments, each of the first light-emitting elements and the second light-emitting elements may include a pixel electrode, a pixel defining layer including an opening overlapping the pixel electrode, an emission layer on the pixel electrode, and an opposite electrode on the emission layer, wherein the photorefractive portion may include a material that is same as a material of the pixel defining layer.

According to some example embodiments, the display panel may further include an encapsulation substrate covering the first light-emitting elements and the second light-emitting elements, wherein an air layer may be between the photorefractive portion and the encapsulation substrate.

According to some example embodiments, the display panel may further include an encapsulation layer covering the first light-emitting elements and the second light-emitting elements, the encapsulation layer including at least one inorganic encapsulation layer and at least one organic encapsulation layer.

According to some example embodiments, an electronic device includes: a display panel including a first display area and a second display area surrounded by the first display area, and an electronic component corresponding to the second display area of the display panel, wherein the display panel includes a substrate, an insulating layer including an organic insulating material, first light-emitting elements in the first display area, second light-emitting elements in the second display area, the second light-emitting elements including light-emitting elements separated from one another to define transmission areas, and a photorefractive portion in each of the transmission areas.

According to some example embodiments, the electronic device may further include a light-blocking layer between the substrate and wirings, the light-blocking layer corresponding to the second light-emitting elements and the wirings that are electrically connected to the second light-emitting elements respectively.

According to some example embodiments, each of the first light-emitting elements and the second light-emitting elements may include a pixel defining layer for defining an emission area, wherein the photorefractive portion may include a material that is same as a material of the insulating layer or the pixel defining layer.

According to some example embodiments, a surface of the photorefractive portion may include a convex surface.

According to some example embodiments, the electronic device may further include an encapsulation substrate covering the first light-emitting elements and the second light-emitting elements, wherein an air layer may be between the photorefractive portion and the encapsulation substrate, and a refractive index of the photorefractive portion may be greater than a refractive index of the substrate and a refractive index of the air layer.

According to some example embodiments, the electronic device may further include an encapsulation layer covering the first light-emitting elements and the second light-emitting elements, the encapsulation layer including at least one inorganic encapsulation layer and at least one organic encapsulation layer, and a refractive index of the photorefractive portion may be greater than a refractive index of the substrate and a refractive index of the encapsulation layer.

According to some example embodiments, the electronic component may include an imaging device or a sensor.

Other aspects, features and characteristics of the disclosure will become better understood through the accompanying drawings, the claims and the detailed description.

BRIEF DESCRIPTION OF THE DRAWINGS

The above and other aspects, features, and characteristics of certain example embodiments of the disclosure will be more apparent from the following description taken in conjunction with the accompanying drawings, in which.

DETAILED DESCRIPTION

Figure 1:
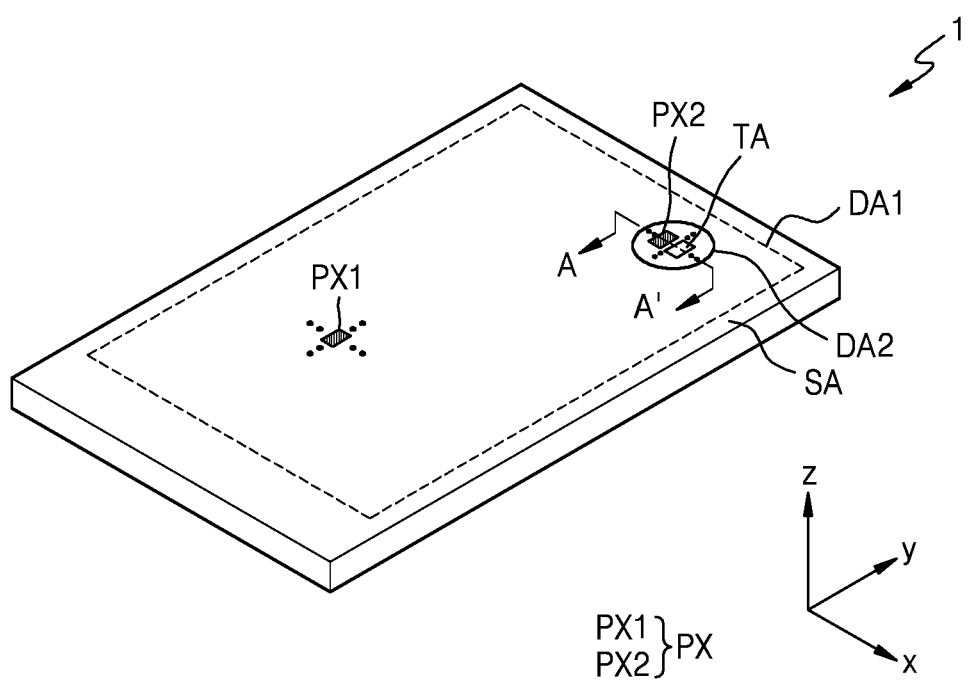
FIG. 1 is a perspective view of an electronic device according to some example embodiments.

Reference will now be made in more detail to example embodiments, which are illustrated in the accompanying drawings, wherein like reference numerals refer to like elements throughout. In this regard, the present example embodiments may have different forms and should not be construed as being limited to the descriptions set forth herein. Accordingly, the example embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The example embodiments will be described below in more detail with reference to the accompanying drawings. Those components that are the same or are in correspondence are rendered the same reference numeral regardless of the figure number, and some redundant explanations may be omitted.

While such terms as "first," "second," etc., may be used to describe various components, such components are not be limited to the above terms. The above terms are used only to distinguish one component from another.

An expression used in the singular encompasses the expression of the plural, unless it has a clearly different meaning in the context.

In the present specification, it is to be understood that the terms "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

It will be understood that when a layer, region, or component is referred to as being "formed on" another layer, region, or component, it may be directly or indirectly formed on the other layer, region, or component. That is, for example, intervening layers, regions, or components may be present.

Sizes of components in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

In the specification, the phrase "A and/or B" denotes A, B, or A and B. In addition, the phrase "at least one of A and B" denotes A, B, or A and B.

In the example embodiments below, when layers, areas, or elements or the like are referred to as being "connected," it will be understood that they may be directly connected or an intervening portion may be present between layers, areas or elements. For example, when layers, areas, or elements or the like are referred to as being "electrically connected," they may be directly electrically connected, or layers, areas or elements may be indirectly electrically connected and an intervening portion may be present.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a perspective view of an electronic device 1 according to some example embodiments.

Referring to FIG. 1, the electronic device 1 includes a first display area DA1, a second display area DA2 surrounded by the first display area DA1, and a peripheral area SA at an outer portion (e.g., outside a footprint) of the first display area DA1.

FIG. 1 shows that, according to some example embodiments, one second display area DA2 is inside the first display area DA1. According to some example embodiments, however, there may be two or more second display areas DA2, and shapes and sizes of the plurality of second display areas DA2 may be different from one another. The peripheral area SA may be a non-display area (e.g., a bezel area) at which pixels are not arranged. The first display area DA1 may be entirely or partially surrounded by the peripheral area SA.

In FIG. 1, the second display area DA2 has a circular shape, but embodiments according to the present disclosure are not limited thereto. In a plan view (or seen from a direction perpendicular or normal to one surface of a substrate), the second display area DA2 may be variously modified to have a circular shape, an elliptical shape, a polygonal shape such as a rectangular shape, a star shape, a diamond shape, etc.

In addition, FIG. 1 shows that the second display area DA2 is at a side (upper right side) of the first display area DA1 having a rectangular shape, but one or more embodiments are not limited thereto. According to some example embodiments, the second display area DA2 may be at a side (e.g., upper left side or upper center) of the first display area DA1 having a rectangular shape.

Hereinafter, according to some example embodiments, although the electronic device 1 including an organic light-emitting display panel is described as an example, but the electronic device 1 according to some example embodiments is not limited thereto. According to some example embodiments, the electronic device 1 may include a display panel such as an inorganic light-emitting display panel or a quantum dot light-emitting display panel. For example, an emission layer of a display element included in a display panel 10 may include an organic material, an inorganic material, quantum dots, an organic material and quantum dots, or an inorganic material and quantum dots.

The electronic device 1 may provide or display images by using light emitted from a light-emitting element that is included in each of a plurality of pixels PX of the first display area DA1 and the second display area DA2. The plurality of pixels PX include first pixels PX1 and second pixels PX2. The first pixels PX1 are two-dimensionally arranged in the first display area DA1 and the second pixels PX2 may be two-dimensionally arranged in the second display area DA2.

The electronic device 1 may provide or display a first image (or first images) (or a main image or main images) by using the light emitted from the light-emitting element included in each of the plurality of first pixels PX1 in the first display area DA1, and may provide a second image (or second images) (or an auxiliary image or auxiliary images) by using the light emitted from the light-emitting element included in each of the plurality of second pixels PX2 in the second display area DA2. The first image and the second image may be parts of one image, or may be independent images from each other. The second image provided by the second display area DA2 may have a resolution less than that of the first image provided by the first display area DA1.

The electronic device 1 may include an electronic component 20 (see FIG. 2) that is in the second display area DA2 and will be described in more detail later, and the second display area DA2 may include a transmission area TA for driving the electronic component 20.

Figure 2:
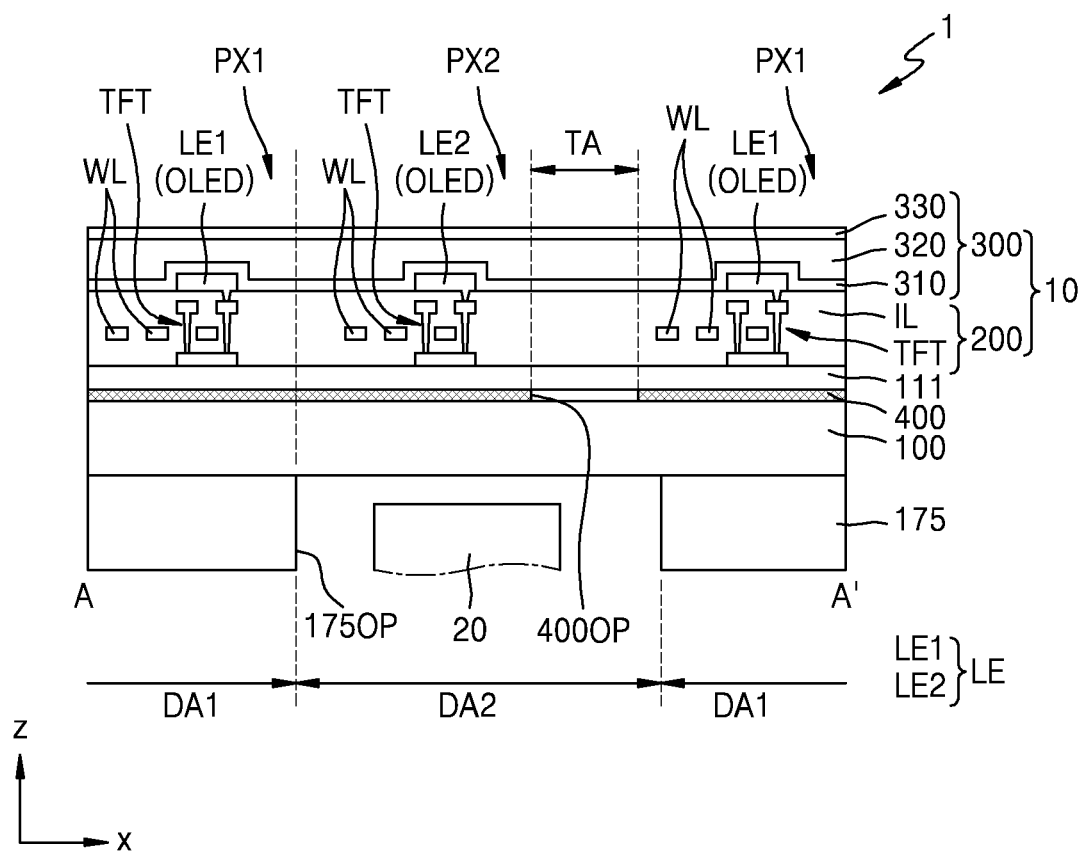
FIG. 2 is a cross-sectional view of an electronic device according to some example embodiments.

FIG. 2 is a cross-sectional view of the electronic device 1 according to some example embodiments. FIG. 2 may correspond to a cross-section of the electronic device 1 taken along the line A-A' of FIG. 1.

Referring to FIG. 2, the electronic device 1 may include the display panel 10 and the electronic component 20, wherein the display panel 10 includes a light-emitting element and the electronic component 20 is under the display panel 10 and corresponds to the second display area DA2.

The electronic component 20 may be in the second display area DA2. The electronic component 20 may include an electronic element using light or sound. For example, the electronic element may include a sensor for measuring a distance such as a proximity sensor, a sensor for sensing a body part of a user (e.g., fingerprint, iris, face, etc.) or an external component (e.g., a stylus), a small-sized lamp outputting light, a speaker configured to emit sound, an image sensor for capturing an image (e.g., camera), etc. The electronic element using light may use light of various wavelength bands such as visible light, infrared rays, ultraviolet rays, etc. The electronic element using sound may use ultrasound waves or sound of another frequency band.

The light output from the electronic component 20 and/or proceeding towards the electronic component 20 may pass through the transmission area TA. According to some example embodiments, when infrared ray transmits through the second display area DA2, a light transmittance may be about 50% or greater, 60% or greater, 70% or greater, 85% or greater, or 90% or greater.

The electronic component 20 in the second display area DA2 may include one or more components. For example, the electronic component 20 may include a light-emitting device and a light-receiving device that are adjacent to each other. Otherwise, one electronic component 20 may have functions of both a light-emitting portion and a light-receiving portion.

An area of the second display area DA2 may be greater than that of a region where the electronic component 20 is arranged. In FIG. 2, it is shown that the area of the second display area DA2 is equal to that of an opening 1750P in a lower protective film, but according to some example embodiments the area of the opening 1750P in the lower protective film may not be equal to that of the second display area DA2. For example, the area of the opening 1750P in the lower protective film may be less than that of the second display area DA2.

The display panel 10 may include a substrate 100, a buffer layer 111 on the substrate 100, a light-emitting element layer 200 on the buffer layer 111, and a thin film encapsulation layer 300 for sealing the light-emitting element layer 200. Also, the display panel 10 may further include a light-blocking layer 400 on the substrate 100 or interposed in a multi-layered structure of the substrate 100. In addition, the display panel 10 may further include a lower protective film 175 under the substrate 100.

The substrate 100 may include glass or a polymer resin. According to some example embodiments, the substrate 100 may include a polymer resin such as polyethersulfone, polyacrylate, polyetherimide, polyethylene naphthalate, polyethylene terephthalate, polyphenylene sulfide, polyarylate, polyimide, polycarbonate, cellulose acetate propionate, etc. The substrate 100 including the polymer resin may be flexible, rollable, or bendable. The substrate 100 may have a multi-layered structure including a layer including the polymer resin and an inorganic layer.

The light-emitting element layer 200 may include a circuit layer including a thin film transistor TFT, an organic light-emitting diode OLED as a light-emitting element LE, and an inorganic insulating structure IL between the circuit layer and the light-emitting element LE.

The first pixels PX1 in the first display area DA1 may each include a pixel circuit PC including the thin film transistor TFT and a first light-emitting element LE1 related to the pixel circuit PC. Also, the first display area DA1 may include wirings WL electrically connected to first light-emitting elements LE1.

The second pixels PX2 in the second display area DA2 may each include a pixel circuit PC including a thin film transistor TFT and a second light-emitting element LE2 related to the pixel circuit PC. Also, the second display area DA2 may include wirings WL electrically connected to second light-emitting elements LE2.

The second display area DA2 may include the transmission area TA. The transmission area TA does not include the second light-emitting elements LE2 of the second pixels PX2 and the wirings WL connected to the second light-emitting elements LE2, and may transmit light or signals. The transmission area TA may transmit the light or signals emitted from the electronic component 20 and/or may transmit light or signals incident into the electronic component 20.

The thin film encapsulation layer 300 may include at least one inorganic encapsulation layer and at least one organic encapsulation layer. In this regard, referring to FIG. 2, the thin film encapsulation layer 300 may include first and second inorganic encapsulation layers 310 and 330, and an organic encapsulation layer 320 between the first and second inorganic encapsulation layers 310 and 330.

The first and second inorganic encapsulation layers 310 and 330 may include one or more inorganic insulating materials from aluminum oxide, titanium oxide, tantalum oxide, hafnium oxide, zinc oxide, silicon oxide, silicon nitride, and silicon oxynitride. The organic encapsulation layer 320 may include a polymer-based material. The polymer-based material may include polyethylene terephthalate, polyethylene naphthalate, polycarbonate, polyimide, polyethylene sulfonate, polyoxymethylene, polyarylate, hexamethyl disiloxane, an acryl-based resin (e.g., polymethyl methacrylate, polyacrylic acid, etc.), or a combination thereof.

The light-blocking layer 400 may be on the substrate 100. For example, the light-blocking layer 400 may be on the substrate 100 and under the light-emitting elements LE and the wirings WL. According to some example embodiments, the light-blocking layer 400 may be in the multi-layered structure of the substrate 100. For example, the light-blocking layer 400 may be between a plurality of sub-layers included in the substrate 100.

The light-blocking layer 400 may include an opening 4000P corresponding to the transmission area TA. The light-blocking layer 400 includes a part which defines the opening 4000P and includes a light-blocking material (e.g., a metallic material, black ink, dye, etc.) included in the light-blocking layer 400, and the part of the light-blocking layer 400 including the above material may correspond to the first light-emitting element LE1 and the wirings WL of the first display area DA1 and the second light-emitting element LE2 and the wirings WL of the second display area DA2. The above parts of the light-blocking layer 400 may be integrally connected as one body. For example, the light-blocking layer 400 may correspond to the first display area DA1 and the entire second display area DA2 except for the transmission area TA, in the display panel 10.

When the electronic component 20 includes a sensor emitting light, the light-blocking layer 400 may block the light emitted from the electronic component 20 from being incident into the pixel circuit PC (see FIG. 3) of each of the second pixels PX2.

The light-blocking layer 400 may prevent or reduce instances of the light incident to the display panel 10 unintentionally being incident to the electronic component 20, due to a diffraction of the light while passing through narrow gaps among the wirings WL. According to some example embodiments, when the electronic component 20 includes an imaging device such as a camera, an image captured by the imaging device may be distorted due to the diffraction of the light. However, when the light-blocking layer 400 is provided as described above, image distortion of the imaging device caused by diffraction may be prevented or reduced.

The light-blocking layer 400 may be connected to a gate electrode, a source electrode, or a drain electrode included in the thin film transistor TFT. Alternatively, the light-blocking layer 400 may be connected to a driving voltage line that provides the pixels PX with power voltage.

The light-blocking layer 400 may include a conductive material such as metal, and a constant voltage or signal is applied to the light-blocking layer 400 to prevent damage to the pixel circuit PC due to electrostatic discharge. There may be a plurality of the light-blocking layers 400 in the second display area DA2, and if necessary, different voltages may be applied to the plurality of light-blocking layers 400.

The light-blocking layer 400 may include metal or metal oxide such as chromium, chromium oxide, etc. In this case, the light-blocking layer 400 may be formed in a single-layered structure or a stacked-layered structure by using a sputtering or an E-beam deposition method. According to some example embodiments, the light-blocking layer 400 may include a light absorbing material. In this case, the light-blocking layer 400 may at least absorb external light. The light absorbing material may include carbon black or an organic insulating material.

The lower protective film 175 is adhered to a lower portion of the substrate 100 to protect and support the substrate 100. The lower protective film 175 may include the opening 1750P corresponding to the second display area DA2. Since the lower protective film 175 includes the opening 1750P, a light transmittance of the second display area DA2 may be improved. The lower protective film 175 may include polyethylene terephthalate (PET) or polyimide (PI).

According to some example embodiments, components such as an input sensing member for sensing a touch input, an anti-reflection member including a polarizer and a retarder, or a color filter and a black matrix, and a transparent window, etc. may be further on the display panel 10.

In addition, according to some example embodiments, the thin film encapsulation layer 300 is used as an encapsulation member for sealing the light-emitting element layer 200, but one or more embodiments are not limited thereto. For example, according to some example embodiments, an encapsulation substrate (e.g., a glass substrate, etc.) that is bonded to the substrate 100 via a sealant or a frit may be used as the member for encapsulating the light-emitting element layer 200.

Figure 3:
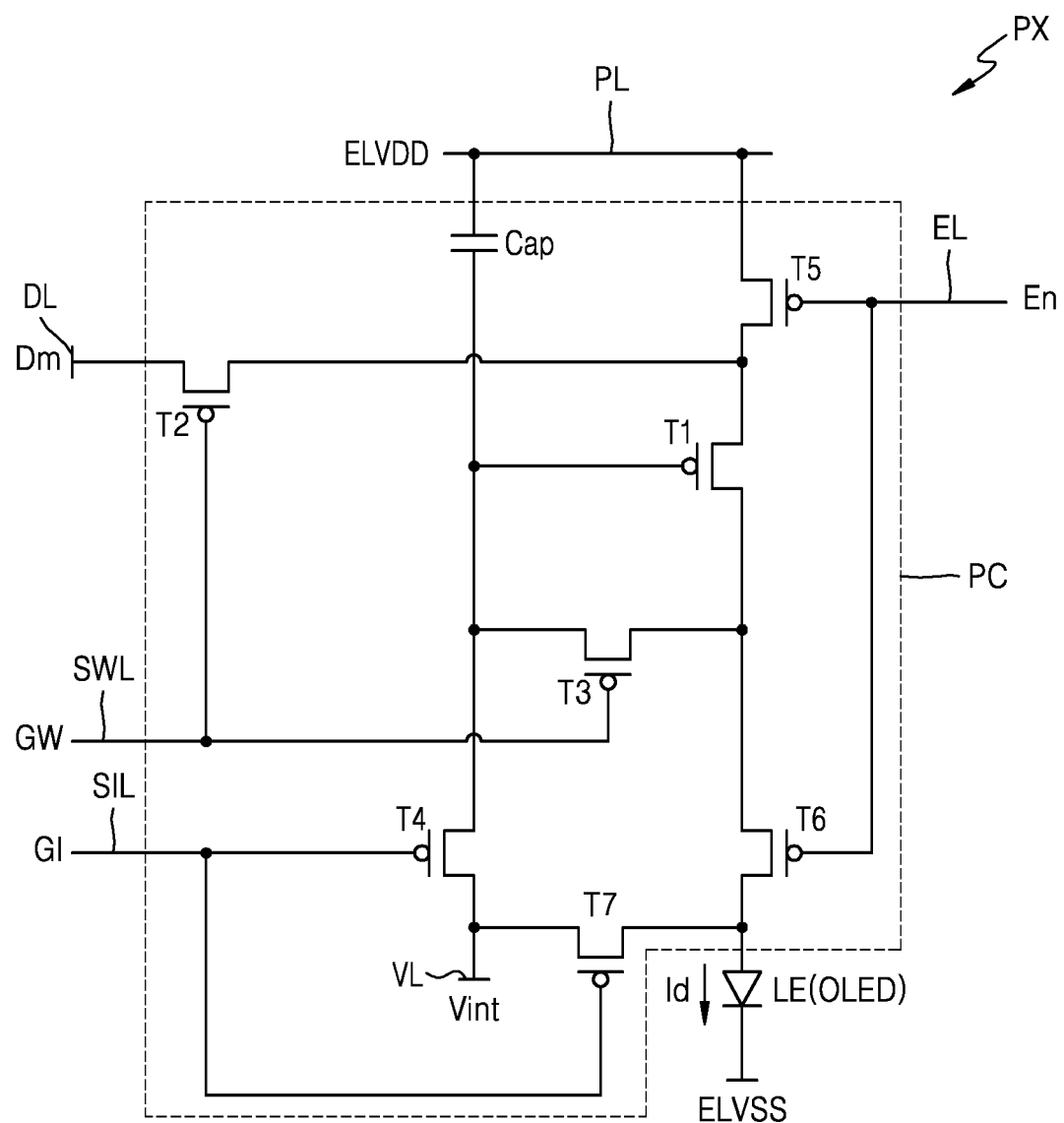
FIG. 3 is an equivalent circuit diagram of a pixel included in a display panel according to some example embodiments.

FIG. 3 is an equivalent circuit diagram of the pixel PX included in the display panel 10 according to some example embodiments.

Referring to FIG. 3, one pixel PX includes the pixel circuit PC including a plurality of thin film transistors (T1 to T7) and a storage capacitor Cap. In addition, the pixel PX includes an organic light-emitting diode OLED that receives a driving voltage through the pixel circuit PC to emit light, as the light-emitting element LE. The pixel PX of FIG. 3 corresponds to the first pixel PX1 and/or the second pixel PX2 described above with reference to FIGS. 1 and 2. Although various components of the pixel circuit PC are illustrated in FIG. 3 according to some example embodiments, embodiments are not limited thereto. For example, according to some example embodiments, the pixel circuit PC may include additional components or fewer components, without departing from the spirit and scope of embodiments according to the present disclosure.

The pixel circuit PC may include the plurality of thin film transistors and the storage capacitor. According to some example embodiments, the thin film transistors may include a driving thin film transistor T1, a switching thin film transistor T2, a compensation thin film transistor T3, a first initialization thin film transistor T4, an operation control thin film transistor T5, an emission control thin film transistor T6, and a second initialization thin film transistor T7, as shown in FIG. 3.

A gate electrode of the driving thin film transistor T1 is connected to an electrode of the storage capacitor Cap, one of a source electrode and a drain electrode of the driving thin film transistor T1 is connected to a driving voltage line PL via the operation control thin film transistor T5, and the other of the source electrode and the drain electrode of the driving thin film transistor T1 is electrically connected to a pixel electrode of the organic light-emitting diode OLED via the emission control thin film transistor T6. The driving thin film transistor T1 receives a data signal Dm according to a switching operation of the switching thin film transistor T2 and supplies a driving current Id to the organic light-emitting diode OLED.

A gate electrode of the switching thin film transistor T2 is connected to a first scan line SWL, one of a source electrode and a drain electrode of the switching thin film transistor T2 is connected to a data line DL, and the other of the source electrode and the drain electrode of the switching thin film transistor T2 is connected to the driving thin film transistor T1 and at the same time connected to the driving voltage line PL via the operation control thin film transistor T5. The switching thin film transistor T2 is turned on according to a scan signal GW transmitted via the first scan line SWL to perform a switching operation, in which the data signal Dm transferred to the data line DL is transferred to the driving thin film transistor T1.

A gate electrode of the compensation thin film transistor T3 is connected to the first scan line SWL, one of a source electrode and a drain electrode of the compensation thin film transistor T3 is connected to the driving thin film transistor T1 and at the same time connected to a pixel electrode of the organic light-emitting diode OLED via the emission control thin film transistor T6, and the other of the source electrode and the drain electrode of the compensation thin film transistor T3 is connected to the electrode of the storage capacitor Cap, the first initialization thin film transistor T4, and the driving thin film transistor T1. The compensation thin film transistor T3 is turned on according to the scan signal GW transferred through the first scan line SWL to electrically connect the gate electrode G1 of the driving thin film transistor T1 to one of the source electrode and the drain electrode (e.g., the drain electrode) of the driving thin film transistor T1 to each other to diode-connect the driving thin film transistor T1.

A gate electrode of the first initialization thin film transistor T4 is connected to a second scan line SIL, one of a source electrode and a drain electrode of the first initialization thin film transistor T4 is connected to the second initialization thin film transistor T7 and an initialization voltage line VL, and the other of the source electrode and the drain electrode of the first initialization thin film transistor T4 is connected to the electrode of the storage capacitor Cap, the compensation thin film transistor T3, and the driving thin film transistor T1. The first initialization thin film transistor T4 is turned on according to a previous scan signal GI transferred through the second scan line SIL to perform an initialization operation, in which an initializing voltage Vint is transferred to the gate electrode of the driving thin film transistor T1 to initialize a voltage at the gate electrode of the driving thin film transistor T1.

A gate electrode of the operation control thin film transistor T5 is connected to an emission control line EL, one of a source electrode and a drain electrode of the operation control thin film transistor T5 is connected to the driving voltage line PL, and the other of the source electrode and the drain electrode of the operation control thin film transistor T5 is connected to the driving thin film transistor T1 and the switching thin film transistor T2.

A gate electrode of the emission control thin film transistor T6 is connected to the emission control line EL, one of a source electrode and a drain electrode of the emission control thin film transistor T6 is connected to the driving thin film transistor T1 and a compensation source electrode S3 of the compensation thin film transistor T3, and the other of the source electrode and the drain electrode of the emission control thin film transistor T6 is electrically connected to the second initialization thin film transistor T7 and the pixel electrode of the organic light-emitting diode OLED.

The operation control thin film transistor T5 and the emission control thin film transistor T6 are simultaneously turned on according to an emission control signal En transferred through the emission control line EL to transfer a driving voltage ELVDD to the organic light-emitting diode OLED and to allow a driving current Id to flow in the organic light-emitting diode OLED.

A gate electrode of the second initialization thin film transistor T7 is connected to the second scan line SIL, one of a source electrode and a drain electrode of the second initialization thin film transistor T7 is connected to the emission control thin film transistor T6 and the pixel electrode of the organic light-emitting diode OLED, and the other of the source electrode and the drain electrode of the second initialization thin film transistor T7 is connected to the first initialization thin film transistor T4 and the initialization voltage line VL. The second initialization thin film transistor T7 is turned on according to the previous scan signal GI transferred through the second scan line SIL to initialize the pixel electrode of the organic light-emitting diode OLED.

FIG. 3 shows an embodiment in which the first initialization thin film transistor T4 and the second initialization thin film transistor T7 are connected to the second scan line SIL, but example embodiments according to the present disclosure are not limited thereto. According to some example embodiments, the first initialization thin film transistor T4 may be connected to the second scan line SIL and driven according to the previous scan signal GI, and the second initialization thin film transistor T7 may be connected to a first scan line or a second scan line of a pixel in a previous row or a next row of the corresponding pixel PX.

One electrode of the storage capacitor Cap is connected to the driving voltage line PL and an opposite electrode of the organic light-emitting diode OLED is connected to a common voltage ELVSS. Accordingly, the organic light-emitting diode OLED emits light by receiving the driving current Id from the driving thin film transistor T1 to display images.

FIG. 3 shows that the pixel circuit PC includes seven thin film transistors T1 to T7 and one storage capacitor Cap, but one or more embodiments are not limited thereto. The number of the TFTs and the number of the storage capacitor may vary depending on a design of the pixel circuit PC.

Figure 4:
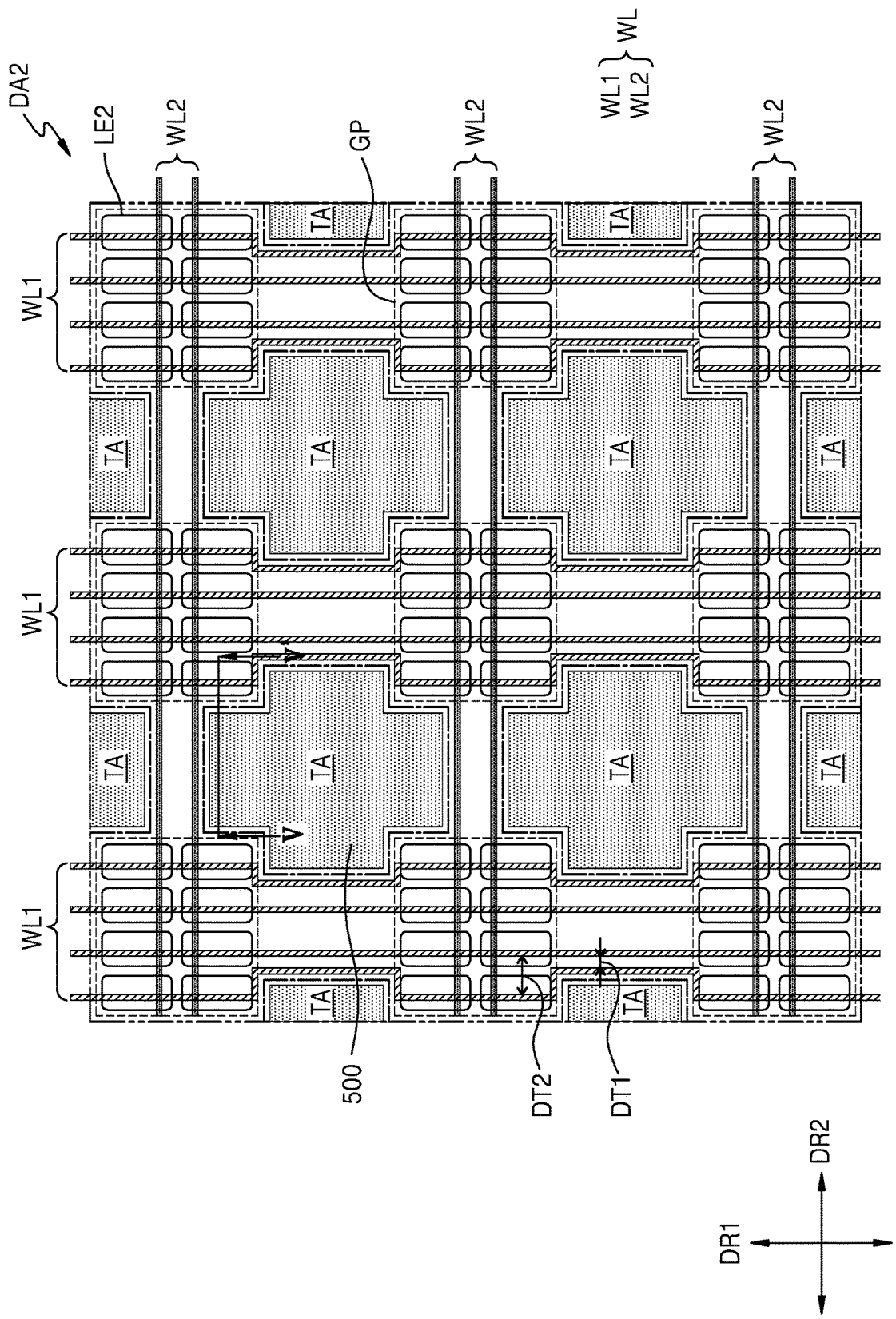
FIG. 4 is a plan view showing a relationship between arrangement of a light-emitting element, wirings, and a photorefractive portion in a display panel according to some example embodiments.

FIG. 4 is a plan view showing a relationship between arrangement of the light-emitting element LE, wirings WL, and a photorefractive portion 500 in the display panel 10 according to an embodiment. FIG. 4 shows an enlarged view of a partial area in the second display area DA2.

Referring to FIG. 4, the second display area DA2 includes the second pixels PX2, and each of the second pixels PX2 may emit the light through the second light-emitting element LE2, for example, organic light-emitting diode OLED (see FIG. 2). A region where the second light-emitting element LE2 emits light may be an emission area. In FIG. 4, eight second light-emitting elements LE2 form one group GP, but one or more embodiments are not limited thereto. The number of the second light-emitting elements LE2 included in one group GP may vary depending on a resolution of the second display area DA2.

The second display area DA2 may include the plurality of wirings WL for electrically connecting the second pixels PX2 to one another. The plurality of wirings WL include first wirings WL1 and second wirings WL2 which extend in directions intersecting each other. The first wirings WL1 may include the data line DL (see FIG. 3) or the driving voltage line PL (see FIG. 3), and the second wirings WL2 may include the scan lines SIL and SWL (see FIG. 3).

The first wiring WL1 may extend in a first direction DR1 in order to connect the plurality of second pixels PX2 arranged in the same column to one another. The second wiring WL2 may extend in a second direction DR2 in order to connect the plurality of second pixels PX2 arranged in the same row to one another. The first direction DR1 and the second direction DR2 may be perpendicular to each other or may be different directions that are not perpendicular to each other.

The first wiring WL1 and the second wiring WL2 may be arranged to reduce an area they occupy on the second display area DA2. For example, a first distance DT1 between first portions of adjacent first wirings WL1 may be less than a second distance DT2 between second portions in the adjacent first wirings WL1. Here, the first portions of the adjacent first wirings WL1 may be between adjacent transmission areas TA, and the second portions of the adjacent first wirings WL1 may be in a region where the group GP of the second light-emitting elements LE2 is arranged. To this end, the first wiring WL1 may be partially bent or curved.

The second light-emitting elements LE2 in the second display area DA2 may be spaced apart from one another to define the transmission areas TA. The transmission areas TA may be defined as regions in the second display area DA2 other than the regions where the second light-emitting elements LE2 and the wirings WL are located. Referring to FIG. 4, the transmission areas TA are denoted by dashed-dot lines. In FIG. 4, the transmission area TA has a cross shape, but the transmission area TA may have various shapes such as a polygonal shape such as a rectangular shape, etc., a circular shape, an elliptical shape, a diamond shape, etc. according to arrangement and shapes of the second light-emitting elements LE2 and the wirings WL.

A photorefractive portion 500 may be in the transmission area TA. The photorefractive portion 500 may have a shape corresponding to the transmission area TA in a plane, for example, a shape that is the same or substantially the same as that of the transmission area TA. According to some example embodiments, the photorefractive portion 500 may have a different shape from that of the transmission area TA. For example, on a plane, the transmission area TA and the photorefractive portion 500 may have different shapes, that is, the transmission area TA may have a cross shape and the photorefractive portion 500 may have a circular or elliptical shape.

Figure 5A:
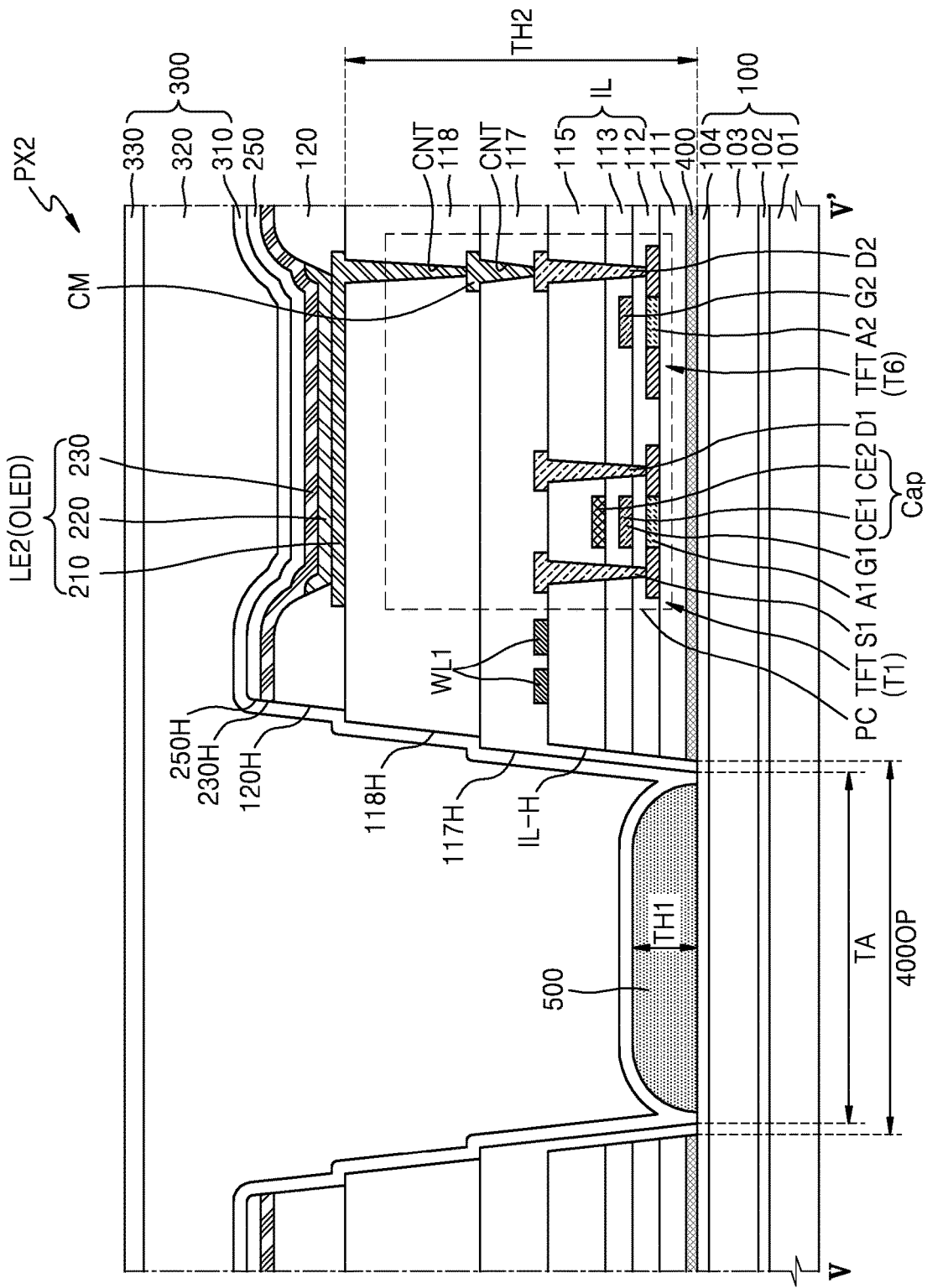
FIGS. 5A and 5B are cross-sectional views of the display panel taken along the line V-V' of FIG. 4.

FIG. 5A is a cross-sectional view of the second pixel PX2 and the transmission area TA in a display panel according to an embodiment. FIG. 5A may be a cross-sectional view of the display panel 10 taken along the line V-V' of FIG. 4.

Referring to FIG. 5A, the pixel circuit PC is on the substrate 100 and the organic light-emitting diode OLED, that is, the second light-emitting element LE2, may be on the pixel circuit PC.

The pixel circuit PC may include the plurality of thin film transistors T1 to T7 and the storage capacitor Cap as described above with reference to FIG. 3, and regarding to this, FIG. 5A shows the driving thin film transistor T1 and the emission control thin film transistor T6.

The substrate 100 may include a polymer resin. The substrate 100 may have a multi-layered structure including a base layer including the polymer resin and an inorganic layer. According to some example embodiments, the substrate 100 may include a first base layer 101, a first inorganic layer 102, a second base layer 103, and a second inorganic layer 104 that are sequentially stacked in the stated order.

The first and second base layers 101 and 103 may each include a polymer resin. For example, the first and second base layers 101 and 103 may each include a polymer resin such as a polyether sulfone (PES), polyarylate (PAR), polyetherimide (PEI), polyethylene naphthalate (PEN), polyethylene terephthalate (PET), polyphynylene sulfide (PPS), polyimide (PI), polycarbonate, cellulose triacetate (TAC), cellulose acetate propionate (CAP), etc. The substrate 100 including the polymer resin may be flexible, rollable, or bendable, and may be transparent.

The first and second inorganic layers 102 and 104 include barrier layers that prevent infiltration of external impurities and may each have a single-layered or multi-layered structure including an inorganic material such as $SiN_x$ and/or $SiO_x$.

A buffer layer 111 is on the substrate 100. The buffer layer 111 may reduce or prevent infiltration of impurities, moisture, or external air from the lower portion of the substrate 100, and may provide a planarized surface on the substrate 100. The buffer layer 111 may include an inorganic material such as an oxide material or a nitride material, an organic material, or an inorganic-organic composite material, and may have a single-layered or multi-layered structure including the inorganic material and the organic material.

The thin film transistors of the second pixel PX2, for example, according to some example embodiments, the driving thin film transistor T1 and the emission control thin film transistor T6, are on the buffer layer 111.

The driving thin film transistor T1 includes a first semiconductor layer A1, a first gate electrode G1, a first source electrode S1, and a first drain electrode D1, and the emission control thin film transistor T6 includes a second semiconductor layer A2, a second gate electrode G2, a second source electrode, and a second drain electrode D2.

The first semiconductor layer A1 and the second semiconductor layer A2 are on the buffer layer 111, and may include polysilicon. According to some example embodiments, the first semiconductor layer A1 and the second semiconductor layer A2 may include amorphous silicon. According to some example embodiments, the first semiconductor layer A1 and the second semiconductor layer A2 may each include an oxide of at least one selected from the group consisting of indium (In), gallium (Ga), stannum, zirconium (Zr), vanadium (V), hafnium (Hf), cadmium (Cd), germanium (Ge), chromium (Cr), titanium (Ti), and zinc (Zn). The first and second semiconductor layers A1 and A2 may each include a channel region, and a source region and a drain region doped with impurities.

A first gate insulating layer 112 may be on the first and second semiconductor layers A1 and A2. The first gate insulating layer 112 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The first gate insulating layer 112 may have a single-layered or a multi-layered structure including the inorganic insulating material.

The first and second gate electrodes G1 and G2 are on the first gate insulating layer 112, while overlapping the first and second semiconductor layers A1 and A2. The first and second gate electrodes G1 and G2 may each include molybdenum (Mo), aluminum (Al), copper (Cu), titanium (Ti), etc., and may have a single-layered or multi-layered structure. For example, the first and second gate electrodes G1 and G2 may each have a single-layered structure including molybdenum (Mo).

The second gate insulating layer 113 may be on the first and second gate electrodes G1 and G2. The second gate insulating layer 113 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The second gate insulating layer 113 may have a single-layered or a multi-layered structure including the inorganic insulating material.

An upper electrode CE2 of the storage capacitor Cap may be on the second gate insulating layer 113. The upper electrode CE2 may overlap the first gate electrode G1 thereunder in the first display area DA1. The first gate electrode G1 and the upper electrode CE2 overlapping each other with the second gate insulating layer 113 therebetween may form the storage capacitor Cap. The first gate electrode G1 may be a lower electrode CE1 of the storage capacitor Cap.

The upper electrode CE2 may include any suitable electrode or conductive material including, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu) in a single-layered or multi-layered structure.

An interlayer insulating layer 115 may cover the upper electrode CE2. The interlayer insulating layer 115 may include an insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$).

When the first gate insulating layer 112, the second gate insulating layer 113, and the interlayer insulating layer 115 include inorganic insulating layers and are collectively referred to as an inorganic insulating structure IL, the inorganic insulating structure IL may include a first hole IL-H corresponding to the transmission area TA. The inorganic insulating structure IL may include the buffer layer 111, and in this case, the first hole IL-H may expose an upper surface of the substrate 100. The first hole IL-H may be obtained by openings in the first gate insulating layer 112, the second gate insulating layer 113, and the interlayer insulating layer 115, wherein the openings are provided to correspond to the transmission area TA and overlap one another. The openings may be separately formed through separate processes or simultaneously formed through the same process. When the openings are formed through separate processes, a step may be generated on an internal surface of the first hole IL-H.

According to some example embodiments, the inorganic insulating structure IL may include a groove, not the first hole IL-H exposing the buffer layer 111. According to some example embodiments, the inorganic insulating structure IL may not include the first hole IL-H corresponding to the transmission area TA.

The first source electrode S1 and the first and second drain electrodes D1 and D2 are on the interlayer insulating layer 115. The first source electrode S1 and the first and second drain electrodes D1 and D2 may each include a conductive material including for example, molybdenum (Mo), aluminum (Al), copper (Cu), titanium (Ti), etc., and may have a single-layered or multi-layered structure including the above-stated materials. For example, the first source electrode S1 and the first and second drain electrode D1 and D2 may each have a multi-layered structure including Ti/Al/Ti.

Also, the first wirings WL1 may be on the interlayer insulating layer 115. The first wirings WL1 may include the data line DL (see FIG. 3) and/or the driving voltage line PL (see FIG. 3).

A first insulating layer 117 may be on the first source electrode S1 and the first and second drain electrodes D1 and D2. A second insulating layer 118 may be on the first insulating layer 117. The first insulating layer 117 and the second insulating layer 118 may respectively include a first planarization layer and a second planarization layer, and may have flat upper surfaces to make a pixel electrode 210 on the first and second insulating layers 117 and 118 provided flat.

The first and second insulating layers 117 and 118 may each include a single-layered or multi-layered structure including an organic material or an inorganic material. The first and second insulating layers 117 and 118 may each include an organic insulating material. The first and second insulating layers 117 and 118 may each include any suitable insulating material including, for example, a general universal polymer (benzocyclobutene (BCB), polyimide, hexamethyldisiloxane (HMDSO), polymethylmethacrylate (PMMA), or polystyrene (PS)), polymer derivatives having phenol groups, acryl-based polymer, imide-based polymer, aryl ether-based polymer, amide-based polymer, fluoride-based polymer, p-xylene-based polymer, vinyl alcohol-based polymer, and blends thereof. The first insulating layer 117 and the second insulating layer 118 may each include any suitable insulating material such as, for example, silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). After arranging the first and second insulating layers 117 and 118, a chemical and mechanical polishing may be performed to provide a flat upper surface.

The first insulating layer 117 and the second insulating layer 118 may respectively include a second hole 117H and a third hole 118H corresponding to the transmission area TA. The second hole 117H and the third hole 118H may overlap the first hole IL-H.

The first insulating layer 117 and the second insulating layer 118 may each include a contact hole CNT for exposing one of the second source electrode and the second drain electrode D2 of the emission control thin film transistor T6. A contact metal CM may be on the contact hole CNT. That is, the contact metal CM may be on the contact hole CNT provided in the first insulating layer 117.

The pixel electrode 210 may be in contact with the second source electrode or the second drain electrode D2 via the contact metal CM to be electrically connected to the thin film transistors TFT.

The pixel electrode 210 may include any suitable conductive oxide material such as, for example, indium tin oxide (ITO), indium zinc oxide (IZO), zinc oxide (ZnO), indium oxide ($In_2O_3$), indium gallium oxide, or aluminum zinc oxide (AZO). According to some example embodiments, the pixel electrode 210 may include a reflective layer including argentum (Ag), magnesium (Mg), aluminum (Al), platinum (Pt), palladium (Pd), aurum (Au), nickel (Ni), neodymium (Nd), iridium (Ir), chromium (Cr), or a compound thereof. According to some example embodiments, the pixel electrode 210 may further include a layer including ITO, IZO, ZnO, or $In_2O_3$ on and/or under the reflective layer. According to some example embodiments, the pixel electrode 210 may include a stack structure including ITO/Ag/ITO.

A pixel defining layer 120 may cover edges of the pixel electrode 210. The pixel defining layer 120 includes an opening that overlaps the pixel electrode 210 and defines an emission area of the pixel. The pixel defining layer 120 increases a distance between an edge of the pixel electrode 210 and the opposite electrode 230 on the pixel electrode 210 to prevent generation of arc at the edge of the pixel electrode 210. The pixel defining layer 120 may include any suitable organic insulating material such as, for example, polyimide, polyamide, an acrylic resin, benzocyclobutene, hexamethyldisiloxane (HMDSO), and a phenol resin, and may be obtained by a spin coating, etc.

The pixel defining layer 120 may include a fourth hole 120H corresponding to the transmission area TA. The fourth hole 120H may overlap the second hole 117H and the third hole 118H.

An intermediate layer 220 is on the pixel defining layer 120 and overlaps the pixel electrode 210. The intermediate layer 220 may include a polymer material or a low-molecular weight material, and may emit red light, green light, or blue light.

An opposite electrode 230 is on the intermediate layer 220. The opposite electrode 230 may include a conductive material having a low work function. For example, the opposite electrode 230 may include a (semi-)transparent layer including argentum (Ag), magnesium (Mg), aluminum (Al), platinum (Pt), palladium (Pd), aurum (Au), nickel (Ni), neodymium (Nd), iridium (Ir), chromium (Cr), lithium (Li), calcium (Ca), or an alloy thereof. Alternatively, the opposite electrode 230 may further include a layer including ITO, IZO, ZnO, or $In_2O_3$ on the (semi-)transparent layer including the above material. The opposite electrode 230 may be integrally provided to entirely cover the first and second display areas DA1 and DA2 (see FIG. 1).

The opposite electrode 230 may include a fifth hole 230H corresponding to the transmission area TA. The fifth hole 230H may overlap the fourth hole 120H.

Layers from the pixel electrode 210, the intermediate layer 220, and the opposite electrode 230 may configure the organic light-emitting diode OLED.

A capping layer 250 may be on the opposite electrode 230. The capping layer 250 may include LiF. Alternatively, the capping layer 250 may include an inorganic insulating material such as silicon nitride, and/or an organic insulating material. In some embodiments, the capping layer 250 may be omitted.

The capping layer 250 may include a sixth hole 250H corresponding to the transmission area TA. The sixth hole 250H may overlap the fifth hole 230H.

The thin film encapsulation layer 300 may be on the capping layer 250. FIG. 5A shows that the thin film encapsulation layer 300 including a first inorganic encapsulation layer 310, a second inorganic encapsulation layer 330, and an organic encapsulation layer 320 between the first and second inorganic encapsulation layers 310 and 330 is on the capping layer 250. The thin film encapsulation layer 300 may cover the first light-emitting elements LE1 in the first display area DA1 and the second light-emitting elements LE2 and the transmission area TA in the second display area DA2, and may also cover the photorefractive portion 500 that will be described later.

The light-blocking layer 400 may be on the substrate 100 and under the second light-emitting elements LE2 and the wirings WL. FIG. 5A shows that the light-blocking layer 400 is between the substrate 100 and the buffer layer 111, but the light-blocking layer 400 may be between a plurality of sub-layers included in the substrate 100, for example, between the first base layer 101 and the first inorganic layer 102, between the first inorganic layer 102 and the second base layer 103, or between the second base layer 103 and the second inorganic layer 104.

The photorefractive portion 500 may be on the substrate 100. The photorefractive portion 500 may be between the substrate 100 and the thin film encapsulation layer 300, that is, a sealing member. The photorefractive portion 500 may correspond to the transmission area TA. An area occupied by the photorefractive portion 500 may be equal to or less than an area of the transmission area TA. A width of the photorefractive portion 500 may be less than a distance between the second light-emitting elements LE2 adjacent to opposite sides of the photorefractive portion 500. Also, the width of the photorefractive portion 500 may be less than a width of the first hole IL-H, a width of the second hole 117H, a width of the third hole 118H, a width of the fourth hole 120H, a width of the fifth hole 230H, a width of the sixth hole 250H, or a width of an opening 4000P in the light-blocking layer 400.

The photorefractive portion 500 may include a single-layered or multi-layered structure including an organic material or an inorganic material. The photorefractive portion 500 may include an organic insulating material. The photorefractive portion 500 may include any suitable photorefractive material such as, for example, a general universal polymer (benzocyclobutene (BCB), polyimide, hexamethyldisiloxane (HMDSO), polymethylmethacrylate (PMMA), or polystyrene (PS)), polymer derivatives having phenol groups, acryl-based polymer, imide-based polymer, aryl ether-based polymer, amide-based polymer, fluoride-based polymer, p-xylene-based polymer, vinyl alcohol-based polymer, and blends thereof. The photorefractive portion 500 may include a transparent material through which the light may pass.

The photorefractive portion 500 may include a material that is the same as that of one of the layers stacked on the substrate 100. According to some example embodiments, the photorefractive portion 500 may include the same material as that of the first insulating layer 117 and the second insulating layer 118. In this case, the photorefractive portion 500 may be obtained through the same process as that of the first insulating layer 117 or the second insulating layer 118. According to some example embodiments, the photorefractive portion 500 may include the same material as that of the pixel defining layer 120. In this case, the photorefractive portion 500 may be obtained through the same process as that of the pixel defining layer 120.

A thickness TH1 of the photorefractive portion 500 may be less than a distance TH2 from the substrate 100 to the pixel electrode 210. According to some example embodiments, a height from the upper surface of the substrate 100 to an upper surface of the photorefractive portion 500 may be less than the distance TH2 from the upper surface of the substrate 100 to a lower surface of the pixel electrode 210. When the photorefractive portion 500 is obtained through the same process as that of the first or second insulating layer 117 or 118, the thickness TH1 of the photorefractive portion 500 may be substantially equal to a thickness of the first insulating layer 117 or the second insulating layer 118. When the photorefractive portion 500 is obtained through the same process as that of the pixel defining layer 120, the thickness TH1 of the photorefractive portion 500 may be substantially equal to a thickness of the pixel defining layer 120. However, when the photorefractive portion 500 is obtained through a separate process from those of the first insulating layer 117, the second insulating layer 118, and the pixel defining layer 120, the thickness TH1 of the photorefractive portion 500 may be different from those of the first insulating layer 117, the second insulating layer 118, and the pixel defining layer 120.

A refractive index of the photorefractive portion 500 may be within a range of about 1.4 to about 1.7. The refractive index of the photorefractive portion 500 may be greater than that of at least one of the substrate 100 or the thin film encapsulation layer 300. A difference between the refractive index of the photorefractive portion 500 and the refractive index of the substrate 100 may have a value within a range of about 0 to about 0.3 or a range from about 0.3 to about 0.7.

Figure 5B:
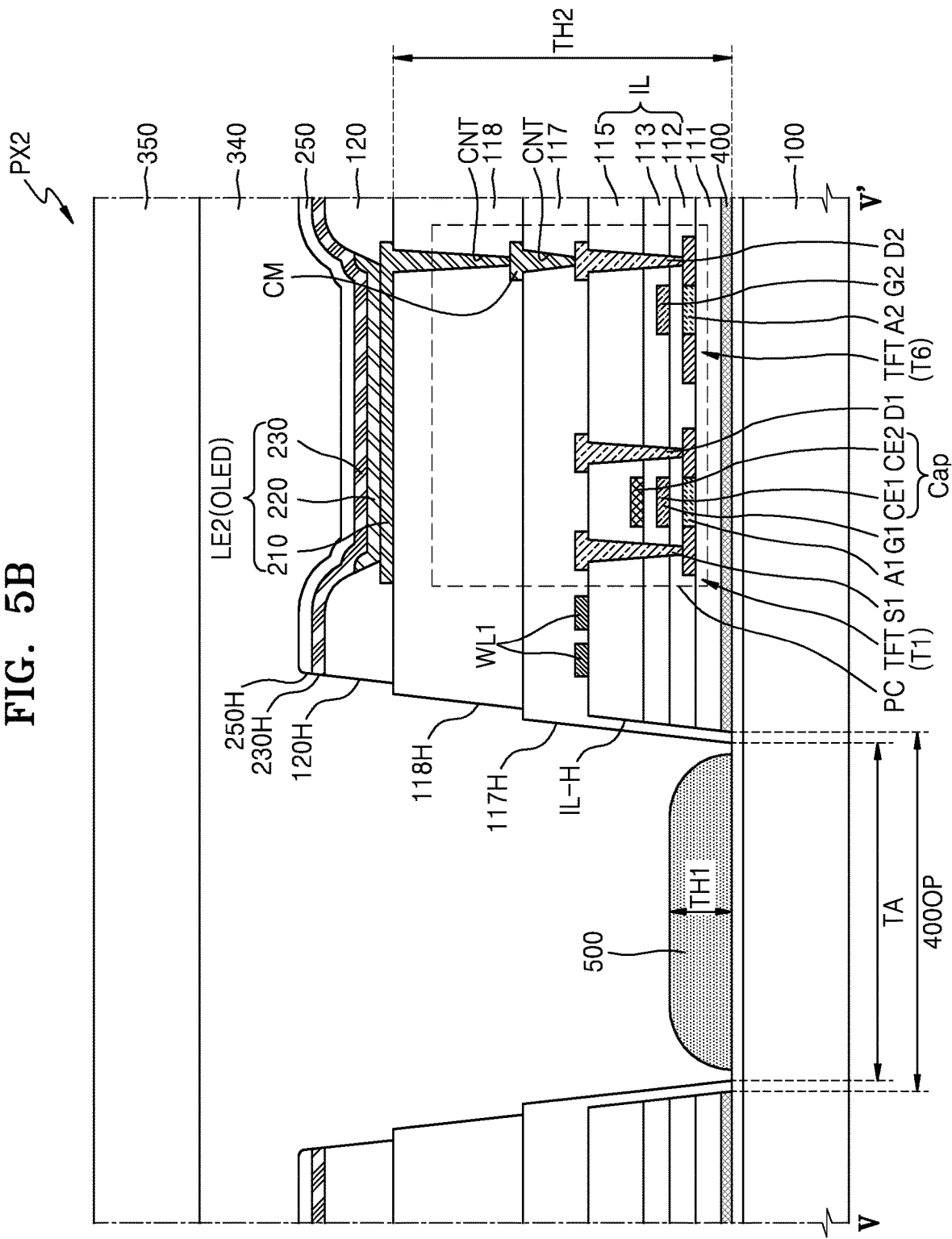

FIG. 5B is a cross-sectional view of the second pixel PX2 and the transmission area TA in a display panel according to some example embodiments. FIG. 5B may be a cross-sectional view of the display panel 10 taken along the line V-V' of FIG. 4.

Referring to FIG. 5B, the stack structure on the substrate and the structures of the pixel circuit PC and the light-emitting element LE2 included in the second pixel PX2 are the same as those described above with reference to FIG. 5A, and differences from FIG. 5A will be described in more detail below.

The substrate 100 may include a transparent insulating substrate including a material such as glass, quartz, etc., and may have a single-layered structure.

An encapsulation substrate 350 instead of the thin film encapsulation layer 300 may be on the capping layer 250. The encapsulation substrate 350 may include a material such as glass, quartz, etc., like the substrate 100. The encapsulation substrate 350 may cover the first light-emitting elements LE1 in the first display area DA1 and the second light-emitting elements LE2 and the transmission area TA in the second display area DA2, and may also cover the photorefractive portion 500. An air layer 340 may be between the photorefractive portion 500 and the encapsulation substrate 350.

A refractive index of the photorefractive portion 500 may be within a range of about 1.4 to about 1.7. The refractive index of the photorefractive portion 500 may be greater than that of at least one of the substrate 100, the encapsulation substrate 350, or the air layer 340. A difference between the refractive index of the photorefractive portion 500 and the refractive index of the substrate 100 may have a value within a range of about 0 to about 0.3 or a range from about 0.3 to about 0.7.

Figure 6A:
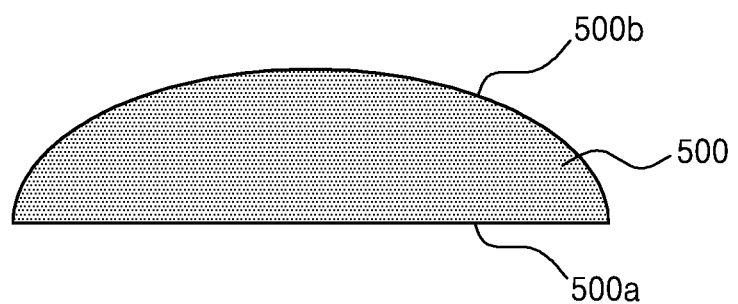
FIGS. 6A and 6B are cross-sectional views of a photorefractive portion in a display panel according to some example embodiments.
Figure 6B:
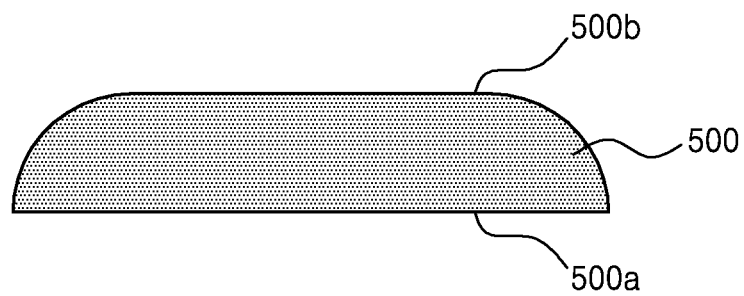

FIG. 6A is a cross-sectional view of the photorefractive portion 500 in a display panel according to some example embodiments, and FIG. 6B is a cross-sectional view of the photorefractive portion 500 in a display panel according to some example embodiments.

Referring to FIG. 6A, the photorefractive portion 500 includes a first surface 500a facing the substrate, and a second surface 500b opposite to the first surface 500a. The first surface 500a of the photorefractive portion 500 may be flat to be in contact with the substrate. The second surface 500b of the photorefractive portion 500 may include a curved surface. The second surface 500b may be entirely curved. The second surface 500b of the photorefractive portion 500 may have a convex surface, so that the light incident to the electronic component 20 may be refracted and condensed while passing through the photorefractive portion 500.

The second pixels PX2 and the wirings WL are on the electronic component 20 located in the second display area DA2, and in this case, an intensity of light incident to the electronic component 20 is reduced less than that of a case, in which the second pixels PX2 and the wirings WL are not on the electronic component 20. However, when the photorefractive portion 500 is on the transmission area TA, the light incident into the electronic component 20 after passing through the transmission area TA may condensed, and thus, the intensity of the light incident into the electronic component 20 may be increased. As such, performance of the electronic component 20 may be improved.

Referring to FIG. 6B, the second surface 500b of the photorefractive portion 500 may be partially curved. For example, a central portion of the second surface 500b may have a flat portion and edges of the second surface 500b may be curved. Therefore, in the light incident perpendicularly to the display panel 10, the light incident to the flat central portion of the photorefractive portion 500 may be incident without being refracted, and the light incident to the edges of the photorefractive portion 500 may be refracted and condensed.

The curved surface in the second surface 500b of the photorefractive portion 500 may be a part of a circle or an ellipse, but embodiments are not limited thereto.

Figure 7:
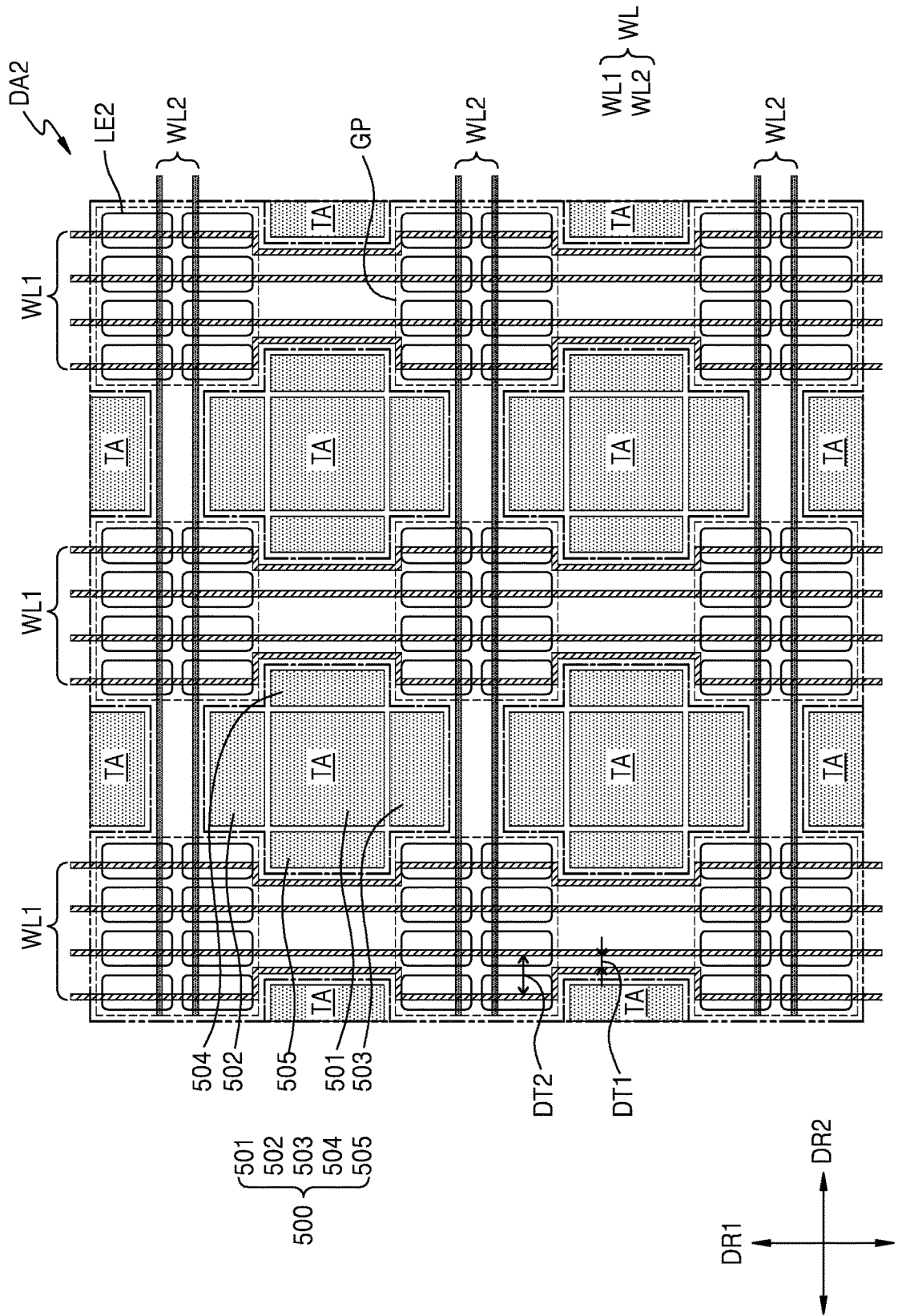
FIG. 7 is a plan view showing a relationship between arrangement of a light-emitting element, wirings, and a photorefractive portion in a display panel according to some example embodiments.

FIG. 7 is a plan view showing a relationship between arrangement of the light-emitting elements LE, wirings WL, and the photorefractive portion 500 in a display panel according to another embodiment. FIG. 7 shows an enlarged view of a partial area in the second display area DA2.

In FIG. 7, arrangement of the second light-emitting elements LE2, the first wirings WL1, the second wirings WL2, and the transmission area TA are the same as those of FIG. 4, and thus, differences from FIG. 4 will be described in more detail below.

Referring to FIG. 7, the photorefractive portion 500 in one transmission area TA may include a plurality of portions 501 to 505. The plurality of portions 501 to 505 may have rectangular shapes, when the second surface 500b of the photorefractive portion 500 is seen from a direction perpendicular to the substrate 100. However, embodiments according to the present disclosure are not limited to the above example, that is, the plurality of portions in the photorefractive portion 500 may be arranged in various shapes, e.g., a polygonal shape (e.g., a triangular shape, a rectangular shape, etc.), a polygon with rounded corners, a circular shape, an elliptical shape, etc. when the second surface 500b of the photorefractive portion 500 is seen from the direction perpendicular to the substrate 100.

In addition, the plurality of portions 501 to 505 may be separated from one another or connected to one another. Among the plurality of portions 501 to 505, based on the first portion 501 at the center of the transmission area TA, the second portion 502 and the third portion 503 may be at opposite sides of the first portion 501 in the first direction DR1, and the fourth portion 504 and the fifth portion 505 may be at the opposite sides of the first portion 501 in the second direction DR2.

The arrangement and shape of the photorefractive portion 500 are examples, and the photorefractive portion 500 may be variously arranged in various shapes within the scope of one or more example embodiments.

Figure 8:
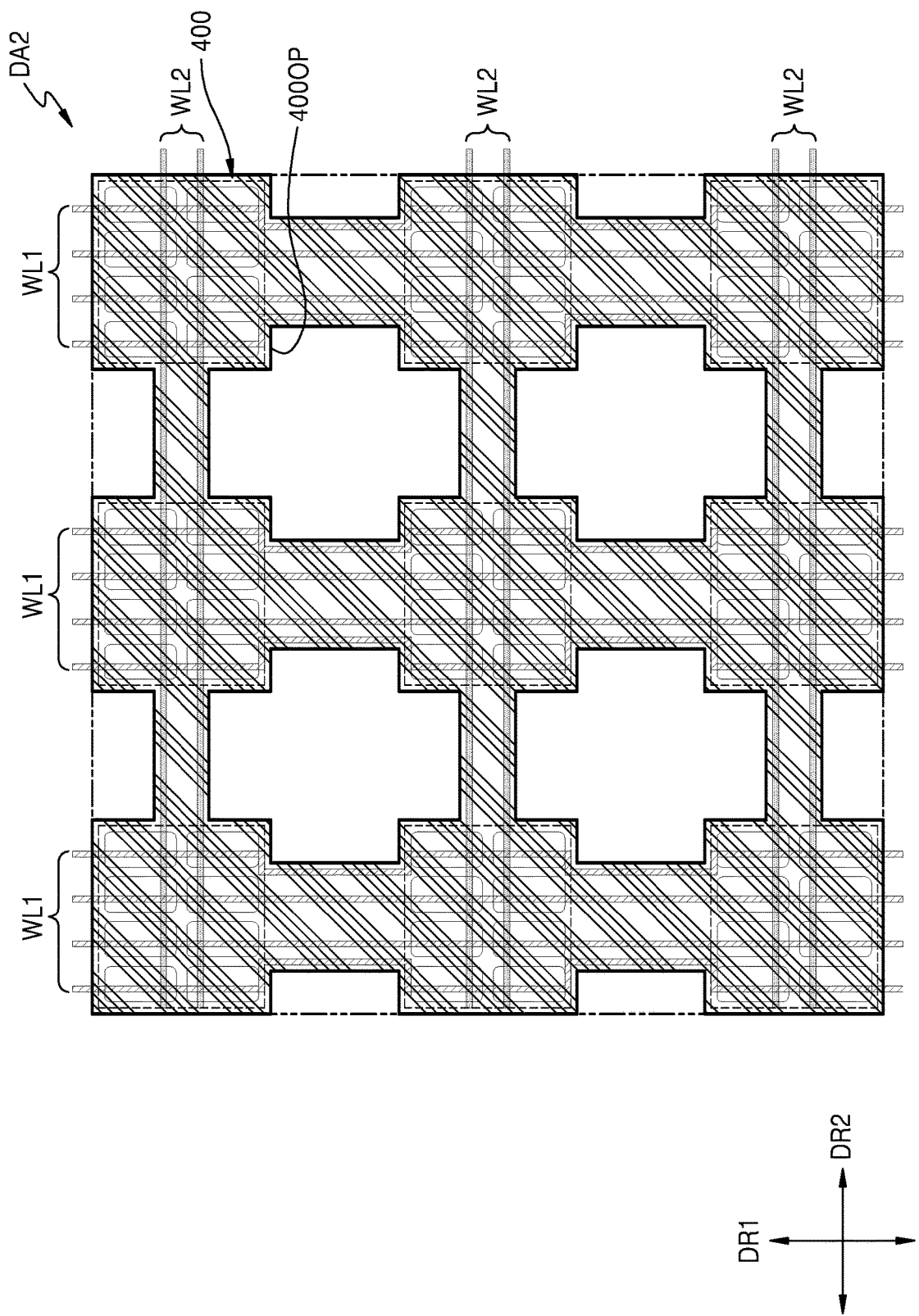
FIG. 8 is a plan view of a light-blocking layer in a display panel according to some example embodiments.

FIG. 8 is a plan view of the light-blocking layer 400 in the display panel 10 according to some example embodiments.

The light-blocking layer 400 corresponds to the second light-emission elements LE2 and the wirings WL electrically connected respectively to the second light-emission elements LE2 in the second display area DA2. In the second display area DA2, a region where the light-blocking layer 400 is not arranged may be defined as the opening 4000P of the light-blocking layer 400, and the opening 4000P of the light-blocking layer 400 corresponds to each of the transmission areas TA. Therefore, the light-blocking layer 400 is located at the other regions than the transmission areas TA in the second display area DA2. The openings 4000P of the light-blocking layer 400 may be spaced apart from one another.

As described above, in the regions other than the transmission areas TA, the light-blocking layer 400 between the substrate 100 and the wirings WL or between the multi-layered structure of the substrate 100 may prevent the incident light that is diffracted while passing through narrow gaps among the wirings WL from reaching the electronic component 20. When the light incident into the second display area DA2 of the display panel 10 is diffracted while passing through the narrow gap between the wirings WL and is unintentionally incident into the electronic component 20, the performance of the electronic component 20 may degrade. Therefore, by arranging the light-blocking layer 400, the degradation in the performance of the electronic component 20 may be prevented or reduced.

According to the example embodiments described above, the display panel having an expanded display area so as to represent images on the region where the electronic component is arranged and the electronic device including the display panel may be implemented. Thus, according to some example embodiments, the display panel may be capable of improving the performance of the electronic component by increasing the intensity of the light incident into the electronic device by arranging the photorefractive portion on the transmission area, through which the light/signal incident into the electronic component is transmitted. Also, the display panel capable of improving the performance of the electronic component by arranging the light-blocking layer on the regions where the light-emitting elements and the wirings are located to prevent or reduce the diffracted light in the light incident to the display panel from unintentionally being incident into the electronic component may be implemented. However, the scope of embodiments according to the disclosure are not limited to the above effects.

It should be understood that embodiments described herein should be considered in a descriptive sense only and not for purposes of limitation. Descriptions of features or aspects within each embodiment should typically be considered as available for other similar features or aspects in other embodiments. While one or more example embodiments have been described with reference to the figures, it will be understood by those of ordinary skill in the art that various changes in form and details may be made therein without departing from the spirit and scope as defined by the following claims and their equivalents.

What is claimed is:

1. A display panel comprising:
    a substrate comprising a first display area and a second display area surrounded by the first display area;
    an insulating layer including an organic insulating material;
    a plurality of first light-emitting elements in the first display area;
    a plurality of second light-emitting elements in the second display area, the plurality of second light-emitting elements comprising light-emitting elements that are spaced apart from one another to define transmission areas; and
    a photorefractive portion in each of the transmission areas,
    wherein the photorefractive portion comprises:
        a first surface facing the substrate; and
        a second surface opposite the first surface,
    wherein a distance between the substrate and a central portion of the second surface is greater than a distance between the substrate and an edge of the second surface,
    wherein the photorefractive portion is spaced apart from each of the light-emitting elements of the plurality of second light-emitting elements, and
    wherein the distance between the substrate and the central portion of the second surface is less than a distance between the substrate and a pixel electrode of an adjacent light-emitting element from among the plurality of second light-emitting elements.

2. The display panel of claim 1, further comprising a light-blocking layer corresponding to the plurality of second light-emitting elements and wirings electrically connected to the plurality of second light-emitting elements respectively.

3. The display panel of claim 2, wherein the light-blocking layer is on the substrate and under the plurality of second light-emitting elements and the wirings.

4. The display panel of claim 2, wherein the light-blocking layer comprises metal or a black pigment or dyes.

5. The display panel of claim 1, wherein the photorefractive portion in each of the transmission areas comprises a plurality of portions.

6. The display panel of claim 1, wherein the second surface comprises a curved surface.

7. The display panel of claim 6, wherein, in the second surface of the photorefractive portion, the central portion includes a flat surface and the edge includes the curved surface.

8. The display panel of claim 1, wherein the photorefractive portion has a refractive index in a range of 1.4 to 1.7.

9. The display panel of claim 1, wherein the photorefractive portion includes an organic insulating material.

10. The display panel of claim 9, wherein the photorefractive portion includes a material same as a material of the insulating layer.

11. The display panel of claim 1, wherein each of the plurality of first light-emitting elements and the plurality of second light-emitting elements comprises:
a pixel electrode;
a pixel defining layer comprising an opening overlapping the pixel electrode;
an emission layer on the pixel electrode; and
an opposite electrode on the emission layer,
wherein the photorefractive portion includes a same material as the pixel defining layer.

12. The display panel of claim 1, further comprising an encapsulation layer covering the plurality of first light-emitting elements and the plurality of second light-emitting elements, the encapsulation layer comprising at least one inorganic encapsulation layer and at least one organic encapsulation layer.

13. A display panel comprising:
a substrate comprising a first display area and a second display area surrounded by the first display area;
an insulating layer including an organic insulating material;
a plurality of first light-emitting elements in the first display area;
a plurality of second light-emitting elements in the second display area, the plurality of second light-emitting elements comprising light-emitting elements that are spaced apart from one another to define transmission areas;
a photorefractive portion in each of the transmission areas; and
an encapsulation substrate covering the plurality of first light-emitting elements and the plurality of second light-emitting elements,
wherein the photorefractive portion comprises:
a first surface facing the substrate; and
a second surface opposite the first surface,
wherein a distance between the substrate and a central portion of the second surface is greater than a distance between the substrate and an edge of the second surface,
wherein the photorefractive portion is spaced apart from each of the light-emitting elements of the plurality of second light-emitting elements, and
wherein an air layer is between the photorefractive portion and the encapsulation substrate.

14. An electronic device comprising:
a display panel comprising a first display area and a second display area surrounded by the first display area; and
an electronic component corresponding to the second display area of the display panel,
wherein the display panel comprises:
a substrate;
an insulating layer including an organic insulating material;
a plurality of first light-emitting elements in the first display area;
a plurality of second light-emitting elements in the second display area, the plurality of second light-emitting elements comprising light-emitting elements that are spaced apart from one another to define transmission areas; and
a photorefractive portion in each of the transmission areas, wherein the photorefractive portion comprises:
a first surface facing the substrate; and
a second surface opposite the first surface,
wherein a distance between the substrate and a central portion of the second surface is greater than a distance between the substrate and an edge of the second surface,
wherein the photorefractive portion is spaced apart from each pixel electrode of the light-emitting elements of the plurality of second light-emitting elements, and
wherein the distance between the substrate and the central portion of the second surface is less than a distance between the substrate and the pixel electrode of an adjacent light-emitting element from among the plurality of second light-emitting elements.

15. The electronic device of claim 14, further comprising a light-blocking layer between the substrate and wirings, the light-blocking layer corresponding to the plurality of second light-emitting elements and the wirings that are electrically connected to the plurality of second light-emitting elements respectively.

16. The electronic device of claim 14, wherein each of the plurality of first light-emitting elements and the plurality of second light-emitting elements comprises a pixel defining layer for defining an emission area, and
wherein the photorefractive portion includes a same material as the insulating layer or the pixel defining layer.

17. The electronic device of claim 14, wherein the second surface of the photorefractive portion comprises a convex surface.

18. The electronic device of claim 14, further comprising an encapsulation substrate covering the plurality of first light-emitting elements and the plurality of second light-emitting elements,
wherein an air layer is between the photorefractive portion and the encapsulation substrate, and
a refractive index of the photorefractive portion is greater than a refractive index of the substrate and a refractive index of the air layer.

19. The electronic device of claim 14, further comprising an encapsulation layer covering the plurality of first light-emitting elements and the plurality of second light-emitting elements, the encapsulation layer comprising at least one inorganic encapsulation layer and at least one organic encapsulation layer,
wherein a refractive index of the photorefractive portion is greater than a refractive index of the substrate and a refractive index of the encapsulation layer.

20. The electronic device of claim 14, wherein the electronic component comprises an imaging device or a sensor.

* * * * *